United States Patent
Jiang et al.

(10) Patent No.: US 9,107,308 B2
(45) Date of Patent: Aug. 11, 2015

(54) GRAPHITIC SUBSTRATES WITH CERAMIC DIELECTRIC LAYERS

(71) Applicants: Nan Jiang, Austin, TX (US); Zvi Yaniv, Austin, TX (US)

(72) Inventors: Nan Jiang, Austin, TX (US); Zvi Yaniv, Austin, TX (US)

(73) Assignee: PEN Inc., Deerfield Beach, FL (US)

( * ) Notice: Subject to any disclaimer, the term of this patent is extended or adjusted under 35 U.S.C. 154(b) by 0 days.

(21) Appl. No.: 14/380,981

(22) PCT Filed: Feb. 26, 2013

(86) PCT No.: PCT/US2013/027717
§ 371 (c)(1),
(2) Date: Aug. 26, 2014

(87) PCT Pub. No.: WO2013/130418
PCT Pub. Date: Sep. 6, 2013

(65) Prior Publication Data
US 2015/0047882 A1    Feb. 19, 2015

Related U.S. Application Data

(60) Provisional application No. 61/603,479, filed on Feb. 27, 2012.

(51) Int. Cl.
*H05K 1/03* (2006.01)
*H05K 1/05* (2006.01)
(Continued)

(52) U.S. Cl.
CPC ............ *H05K 1/053* (2013.01); *C04B 41/009* (2013.01); *C04B 41/52* (2013.01); *C04B 41/90* (2013.01); *H05K 1/0284* (2013.01); *H05K 1/09* (2013.01); *H05K 3/12* (2013.01);
(Continued)

(58) Field of Classification Search
CPC ............ H05K 1/00; H05K 1/18; H05K 1/053; H05K 1/056; H05K 3/10; H01L 23/142; H01L 23/3736; H01L 31/02; H01L 31/068; H01L 31/0224; H01M 8/02; H01M 8/10; H01M 8/24
See application file for complete search history.

(56) References Cited

U.S. PATENT DOCUMENTS 5,841,608 A * 11/1998 Kasamatsu et al. ........ 360/236.6
6,020,083 A *  2/2000 Breault et al. .............. 429/492
(Continued)

FOREIGN PATENT DOCUMENTS

EA    008748 B1    8/2007
EP    0790762 B1   10/2003
(Continued)

OTHER PUBLICATIONS

International Bureau of WIPO, International Preliminary Report on Patentability, International Application No. PCT/2013/027717, dated Sep. 12, 2014.
Russian Federation International Searching Authority; International Search Report & Written Opinion for PCT/US2013/027717; May 23, 2013; Moscow, RU.

*Primary Examiner* — Xiaoliang Chen
(74) *Attorney, Agent, or Firm* — Kelly Kordzik; Matheson Keys & Kordzik PLLC (57) ABSTRACT

Different kinds of printing pastes or inks are utilized in various combinations to develop multiple ceramic dielectric layers on graphitic substrates in order to create effective dielectric ceramic layers that combine good adhesion to both graphitic substrates and printed copper traces, and strong insulating capability. The pastes or inks may comprise a high thermal conductivity powder.

14 Claims, 8 Drawing Sheets

(51) Int. Cl.
  *C04B 41/90* (2006.01)
  *C04B 41/00* (2006.01)
  *C04B 41/52* (2006.01)
  *H05K 1/02* (2006.01)
  *H05K 1/09* (2006.01)
  *H05K 3/12* (2006.01)
  *H01L 23/373* (2006.01)
  *H05K 1/18* (2006.01)
  *C04B 111/00* (2006.01)

(52) U.S. Cl.
  CPC .... *C04B 2111/00844* (2013.01); *H01L 23/373* (2013.01); *H01L 2924/0002* (2013.01); *H05K 1/181* (2013.01); *H05K 2201/0104* (2013.01); *H05K 2201/0137* (2013.01); *H05K 2201/0195* (2013.01); *H05K 2201/0323* (2013.01); *H05K 2201/06* (2013.01); *H05K 2201/10106* (2013.01)

(56) References Cited

U.S. PATENT DOCUMENTS

| | | | | |
|---|---|---|---|---|
| 6,025,062 | A * | 2/2000 | Krenkel et al. | 428/293.4 |
| 6,301,079 | B1 * | 10/2001 | Hanamoto et al. | 360/236.5 |
| 7,303,005 | B2 | 12/2007 | Reis et al. | |
| 2006/0101860 | A1 * | 5/2006 | Chen | 65/374.11 |
| 2006/0269753 | A1 * | 11/2006 | Peng et al. | 428/408 |
| 2007/0212567 | A1 * | 9/2007 | Esaki et al. | 428/650 |
| 2011/0001418 | A1 * | 1/2011 | Tsai | 313/46 |
| 2011/0041903 | A1 * | 2/2011 | Zehavi et al. | 136/255 |
| 2012/0298408 | A1 * | 11/2012 | Nagatomo et al. | 174/260 |

FOREIGN PATENT DOCUMENTS

| | | |
|---|---|---|
| RU | 2256307 C2 | 7/2005 |
| RU | 92568 U1 | 3/2010 |
| RU | 2411609 C1 | 2/2011 |

* cited by examiner

GRAPHITIC SUBSTRATES WITH CERAMIC DIELECTRIC LAYERS

This application claims priority to U.S. Provisional Application Ser. No. 61/603,479, which is hereby incorporated by reference herein.

TECHNICAL FIELD

This application relates in general to electronic circuitry, and in particular, to conductivity of heat in electronic circuitry.

BACKGROUND INFORMATION

Thermal management materials with high thermal conductivity, high thermal diffusivity, machineability and low coefficient of thermal expansion ("CTE") at low cost are desirable. For many electronic applications it would be beneficial if the material was not electrically conductive so that electronic components could be assembled directly onto the high thermal conductivity material. However, materials with high thermal conductivity are also typically electrically conductive. For example, carbon-based materials, such as graphite and graphene, typically have high thermal conductivity and are also electrically conductive. It would be desirable to have high thermal conductivity ceramic dielectric layers on graphitic substrates (i.e., a pure graphite substrate or a graphite-metal composite substrate) for fabrication of a high-performance circuit board through printing copper ("Cu") circuit traces on the top of the ceramic dielectric layers.

Besides providing high thermal performance and sufficient dielectric strength, the dielectric layers should also possess a strong, adhesion with graphitic substrates, be compatible with Cu paste printing and curing processes that require a curing temperature over 400° C., and possess a strong adhesion with the Cu printed circuit traces.

DETAILED DESCRIPTION

In order to create effective dielectric ceramic layers that combine good adhesion to both graphitic substrates and printed Cu, and strong insulating capability, multiple ceramic layer structures on graphitic substrates are implemented in embodiments of the present invention.

Generally, compared with polymeric dielectric layers (e.g., epoxy, silicone, polyimide), ceramic-type dielectric layers (e.g., made with ceramic powders, such as aluminum nitride ("AlN"), boron nitride ("BN"), silicon carbide ("SiC"), etc.) have much higher thermal conductivity and a lower CTE that matches well with typical semiconductor materials (e.g., Si, GaN, GaAs).

In embodiments of the present invention, different kinds of printing pastes or inks are utilized in various combinations, some of which are more specifically described herein, to develop multiple ceramic dielectric layers on graphitic substrates. The pastes or inks may comprise a high thermal conductivity powder (e.g., AlN, BN, SiC, or graphite micron powders) and a nonorganic binder. Water may be used as a vehicle to adjust the viscosity. The pastes or inks are further described in Table 1.

TABLE 1

| | Composition | Advantages | Disadvantages |
|---|---|---|---|
| AlN paste or ink | AlN powders + Lithium polysilicate binder + vehicle (e.g., water) | Good adhesion to printed Cu traces (no delamination occurred during the taping test). Intrinsically had good thermal conductivity and insulating properties. | Poor adhesion to graphitic substrate (delamination occurred during the taping test). |
| BN paste or ink | BN powders + monoaluminum phosphate binder + vehicle (e.g., water) | Intrinsically had good thermal conductivity and insulating properties | Poor adhesion to both graphitic substrate and Cu traces (delamination occurred during the taping test). |
| SiC paste or ink | SiC powders + monoaluminum phosphate binder + vehicle (e.g., water) | Good adhesion to both graphitic substrate and Cu printed traces (no delamination occurred during the taping test). Intrinsically had good thermal conductivity. | Weak instating capability (i.e., a weak electrically insulating capability) |
| Graphite paste or ink | Graphite powders with $Al_2O_3$ addition + silicate binder + vehicle (e.g., water) | Good adhesion to graphitic substrate (no delamination occurred during the taping test). Intrinsically had a good thermal conductivity. | Reacted with Cu printed traces during Cu curing process. Electrically conductive material and cannot be used as the sole insulating layer. |

Figure 1:
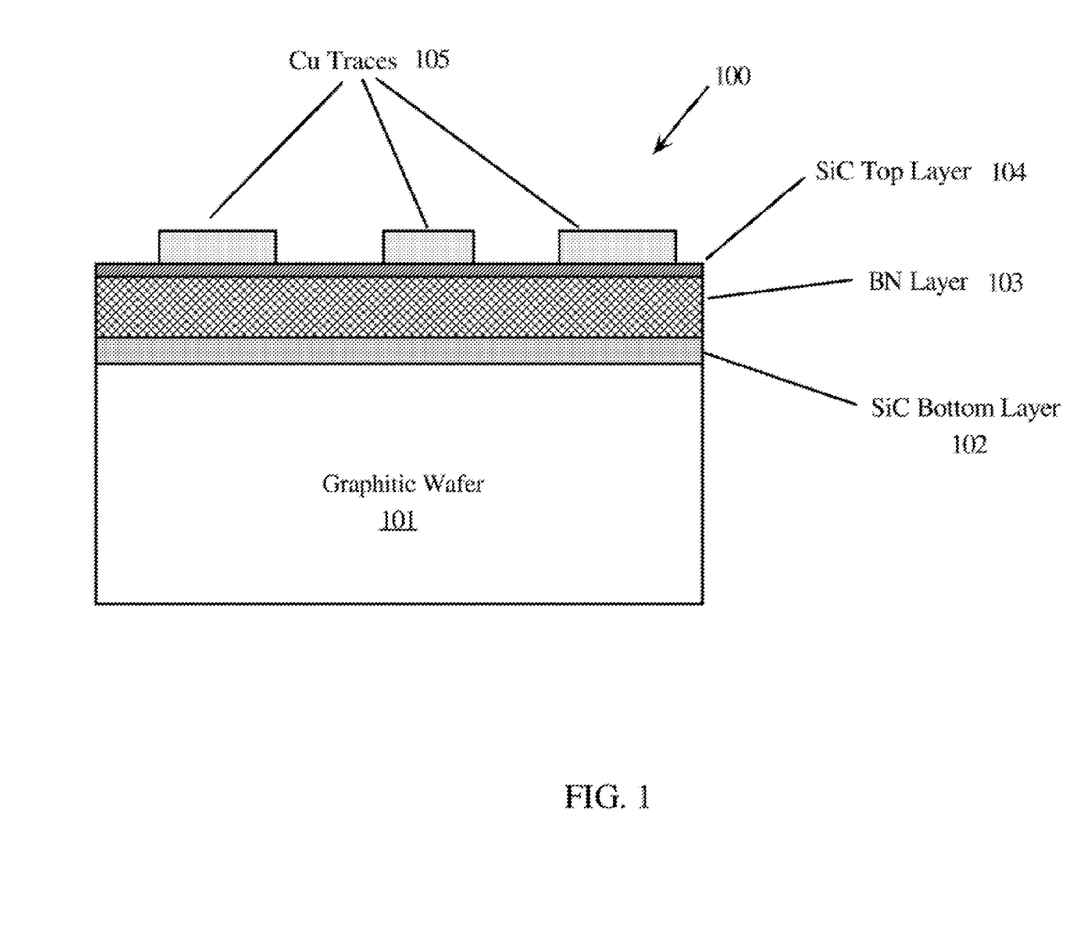
FIG. 1 illustrates an embodiment of the present invention.

A SiCl/BN/SiC/Graphitic-waier structure 100 in accordance with embodiments of the present invention is illustrated in cross-section in FIG. 1. As indicated in Table 1, the bottom SiC layer 102, possesses a strong adhesion to the graphitic wafer 101, the middle BN layer 103 offers sufficient electrical insulating strength, and the top SiC layer 104 enhances the adhesion to the Cu traces 105. Each of the layers 102-105 may he deposited by ink or paste printing or spraying techniques well known in the art.

Figure 2:
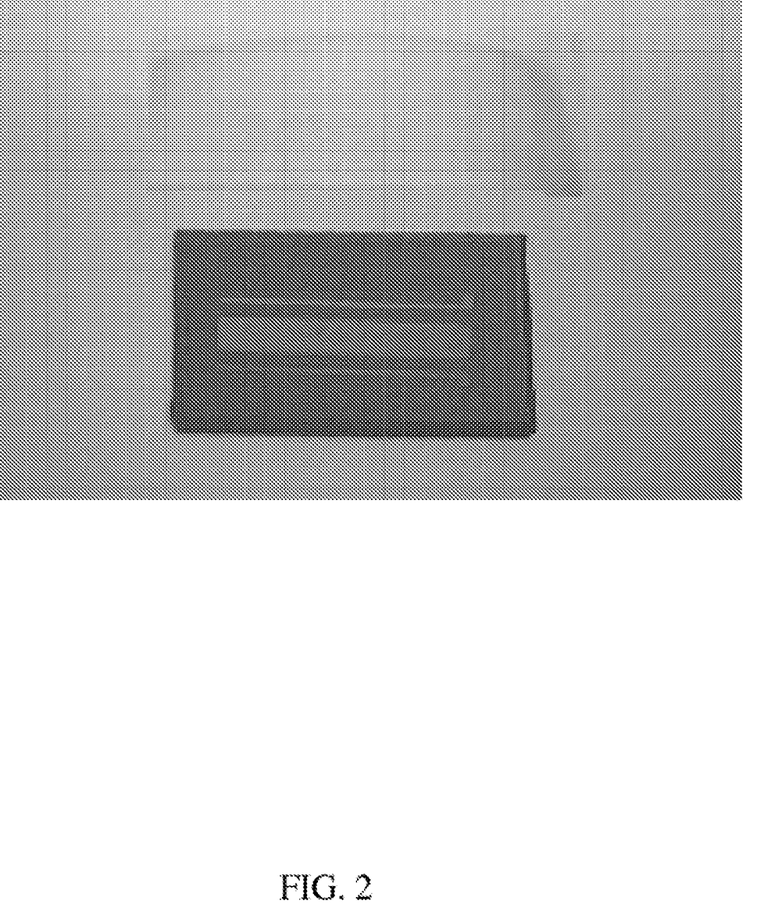
FIG. 2 illustrates a digital image of copper traces printed on a wafer structure as illustrated in FIG. 1, showing that there is not any delamination after a taping test.

FIG. 2 shows a LED circuit board made according to this SiC/BN/SiC/Graphitic-wafer design 100. From FIG. 2, it can he seen for both the ceramic layers and Cu traces, no delamination occurs after a taping test (an adhesive tape is pressed on the layer or trace and pulled off; no peeled off Cu or ceramic fragments were left on the tape), indicating a good adhesion strength of this structure.

Figure 3A:
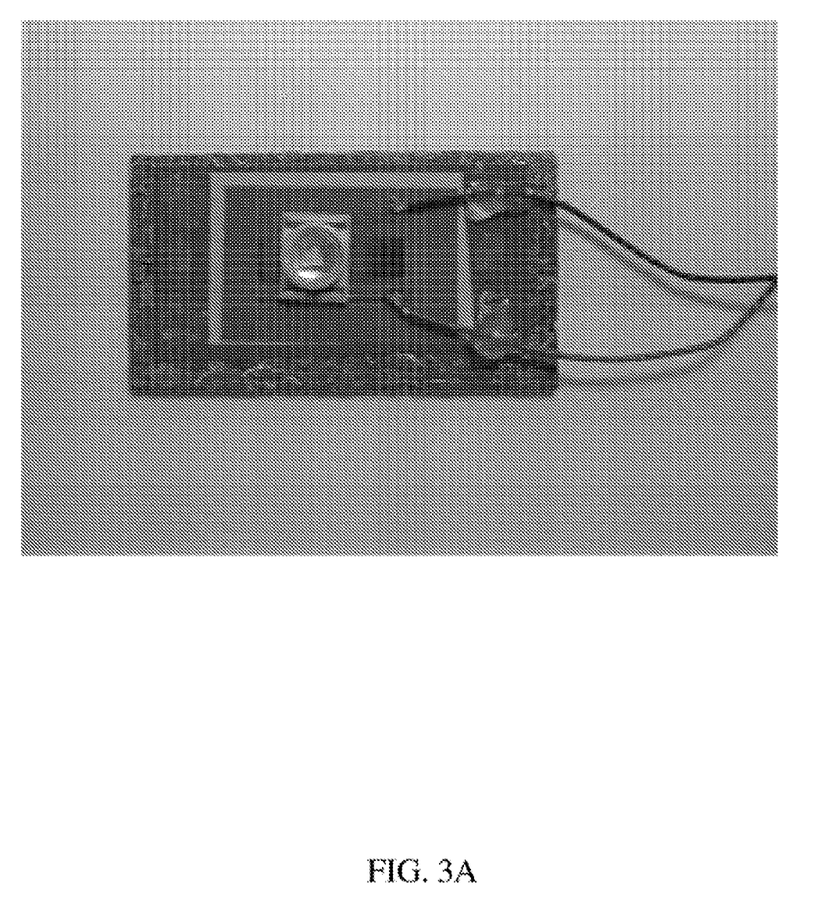
FIGS. 3A-3B show digital images of a circuit board configured with a wafer structure as illustrated in FIG. 1 with an LED soldered thereon.
Figure 3B:
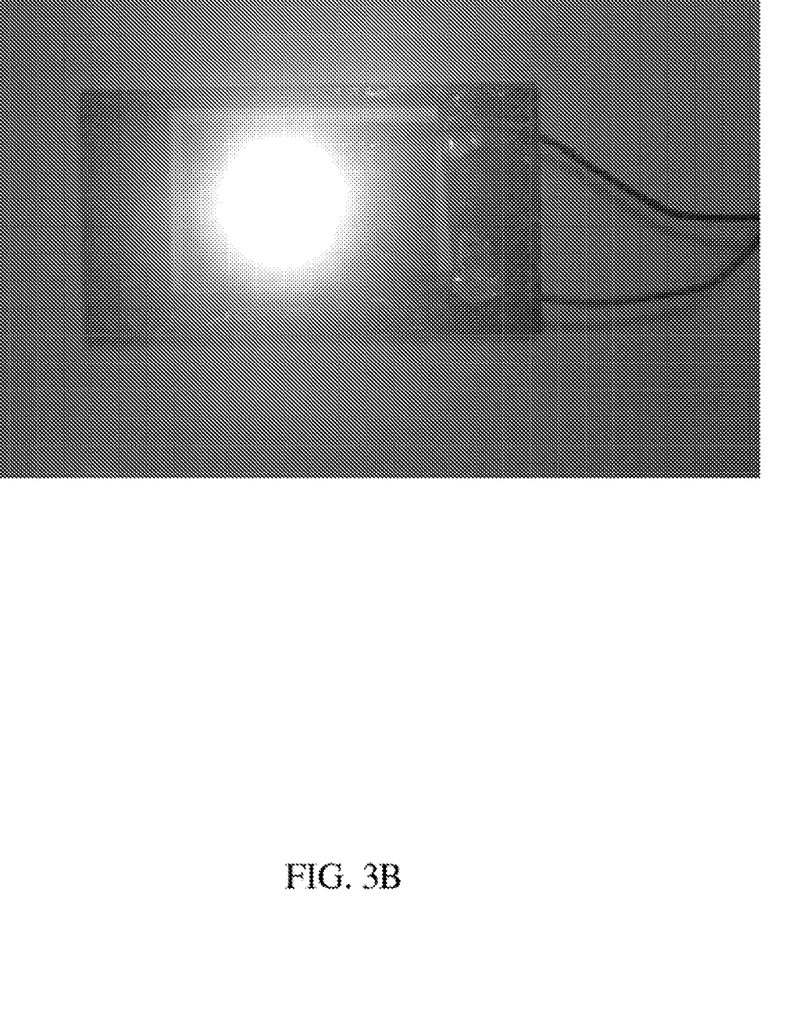

The Cu traces 105 on the ceramic dielectric layer are configured to be solderable. As shown in FIGS. 3A-3B, a chip can be tightly soldered onto the Cu traces (e.g., using lead-free tin solder). FIG. 3B shows that the structure was successful by the activation of the LED. Note that the lighter colored layer in FIGS. 3A-3B is the middle BN layer 103.

Figure 4:
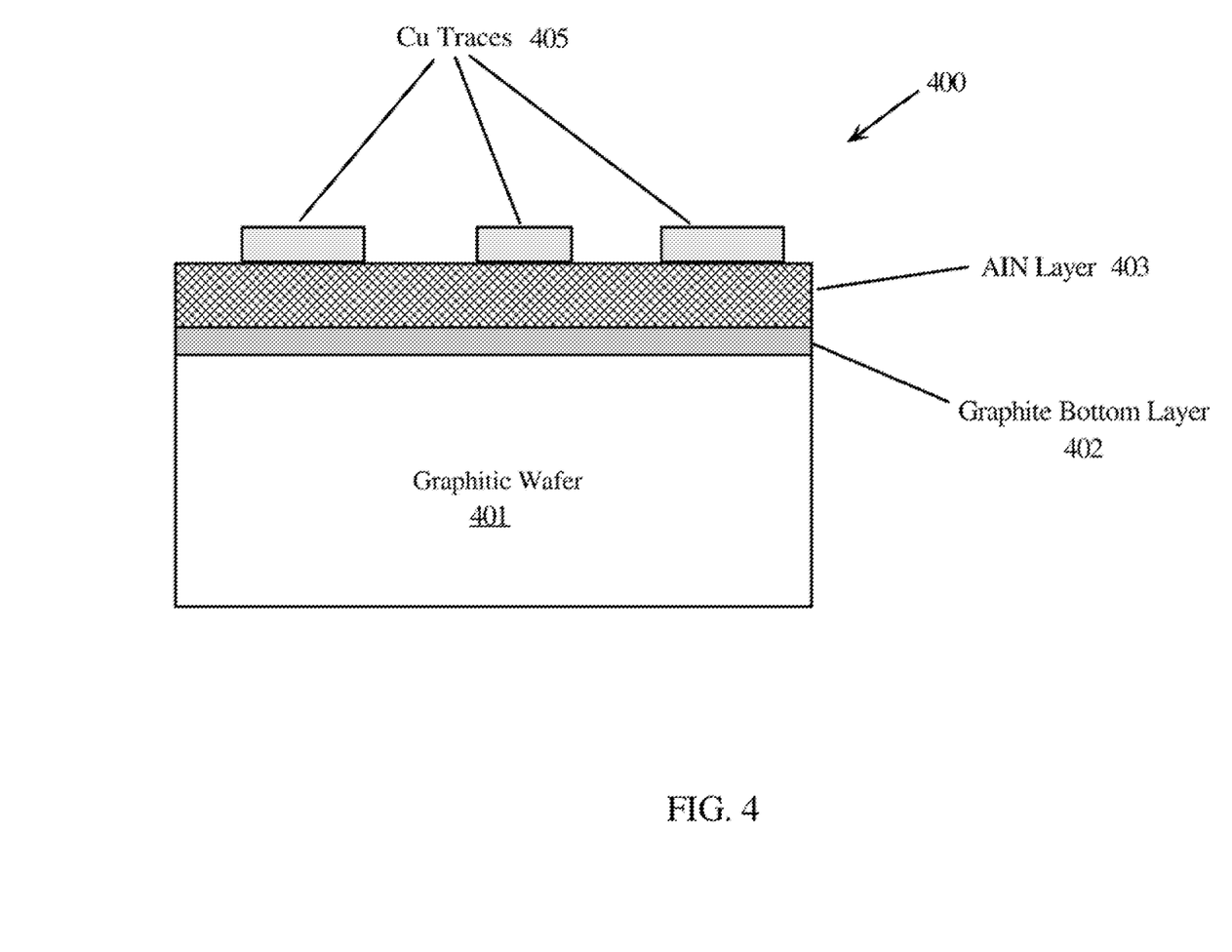
FIG. 4 illustrates an embodiment of the present invention.

An AlN/Graphite/Graphitic-wafer structure 400 in accordance with embodiments of the present invention is illustrated in cross-section in FIG. 4. The bottom graphite layer 402 may be printed or sprayed on the graphitic wafer 401. Using a diluted graphite paste may provide, a stronger adhesion to the graphitic water. The AlN layer 403 may be printed or sprayed onto the graphite layer 402. The copper ("Cu") traces 405 may be printed or sprayed onto the AlN layer 403.

Figure 5A:
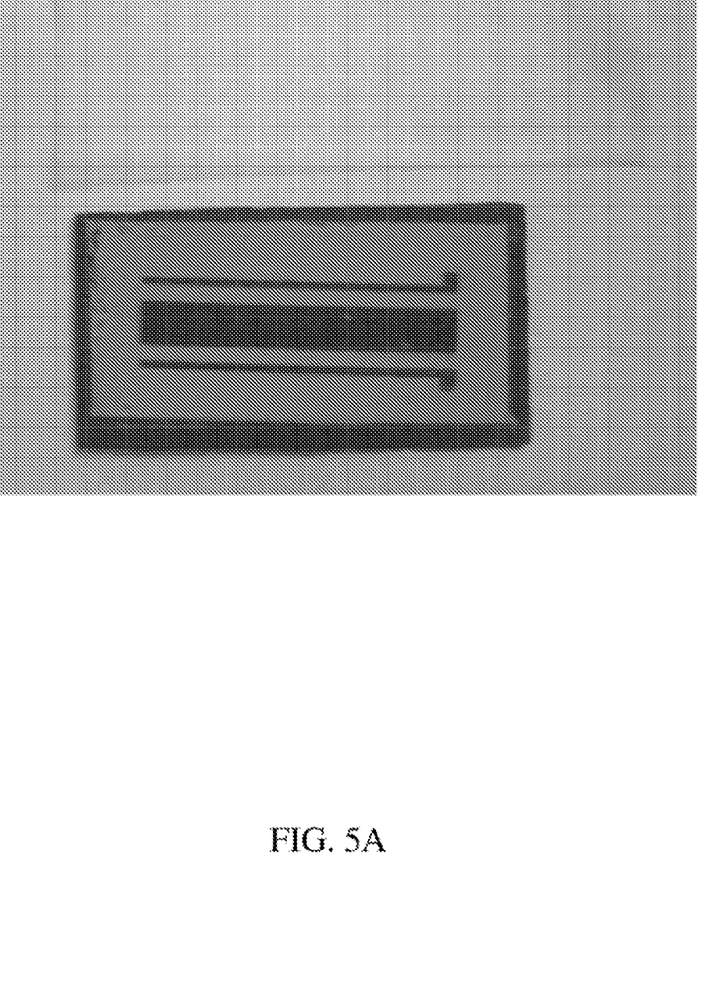
FIGS. 5A-5B show digital images of as circuit board configured in accordance with the embodiment illustrated in FIG. 4 with LEDs soldered thereon.
Figure 5B:
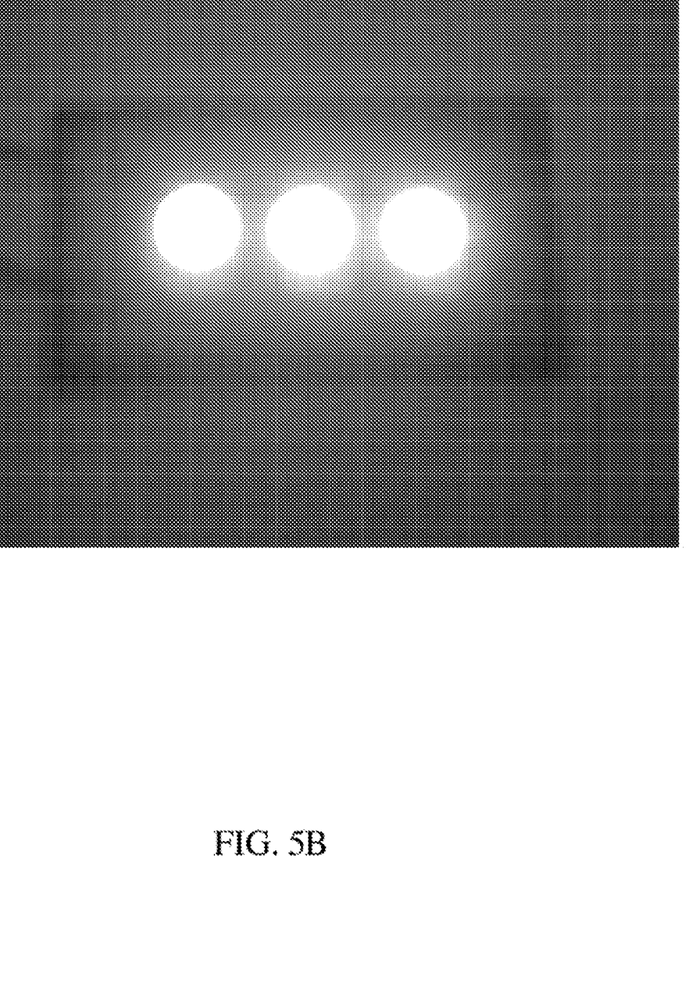

FIGS. 5A-5B show a LED circuit hoard manufactured based on the foregoing AlN/Graphite/Graphitic-wafer 400. No delamination occurred after a taping test, and also the LED chips can be tightly soldered onto the Cu traces 405. FIG. 5B shows that the structure assembly was successful by the activation of the LEDs.

Figure 6:
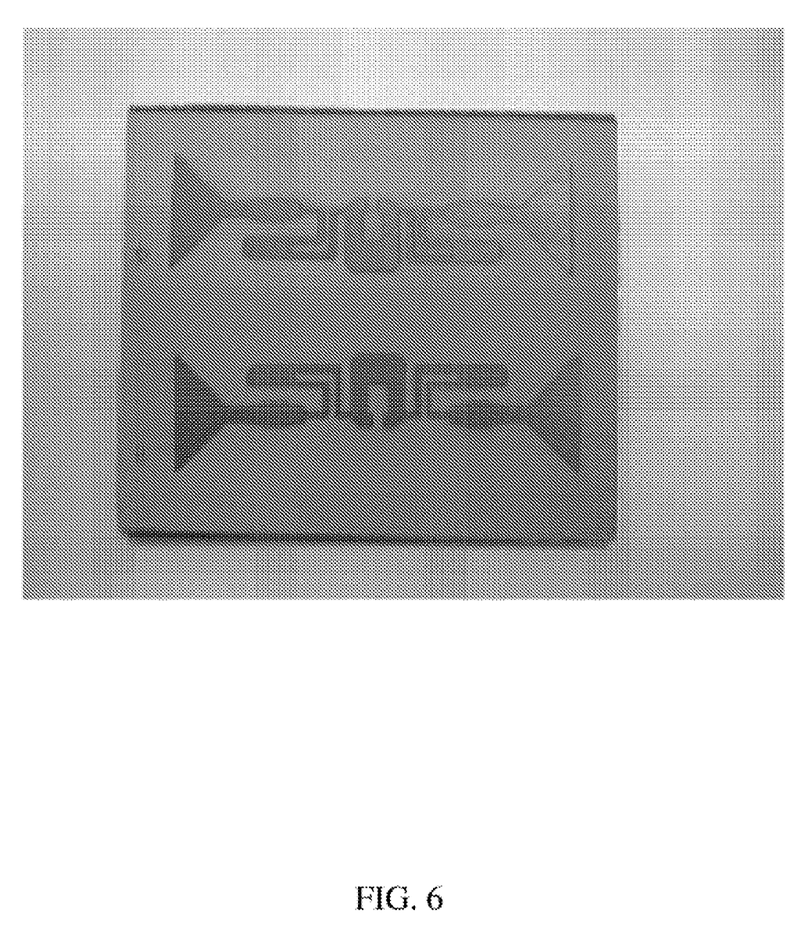
FIG. 6 shows a digital image of a RFID circuit board configured with a wafer structure in accordance with the embodiment illustrated in FIG. 4, with a size of 85 mm×70 mm.

FIG. 6 shows a RFID circuit board built on an AlN/Graphite/Graphitic-wafer substrate 400, wherein two RFID patterned circuits 405 were printed on the top of the AlN layer 403.

What is claimed is:

1. A structure for electrical circuitry comprising:
electrically conducting traces;
a graphitic substrate; and
a plurality of layers separating the electrically conducting traces from the graphitic substrate, wherein the plurality of layers are selected from the group consisting of:
(i) a plurality of different ceramic dielectric layers,
(ii) a graphitic layer and a ceramic dielectric layer, and
(iii) a graphitic layer and two or more different ceramic dielectric layers,
wherein the plurality of layers are a first silicon carbide layer deposited onto the graphitic substrate, a boron nitride layer deposited onto the first silicon carbide layer, and a second silicon carbide layer deposited onto the boron nitride layer, wherein the electrically conducting traces are deposited onto the second silicon carbide layer.

2. The structure as recited in claim 1, wherein the electrically conducting traces comprise copper.

3. A structure for electrical circuitry comprising:
electrically conducting traces;
a graphitic substrate; and
a plurality of layers separating the electrically conducting traces from the graphitic substrate, wherein the plurality of layers are selected from the group consisting of:
(i) a plurality of different ceramic dielectric layers,
(ii) a graphitic layer and a ceramic dielectric layer, and
(iii) a graphitic layer and two or more different ceramic dielectric layers,
wherein the plurality of layers are a graphite layer deposited onto the graphitic substrate,
and an aluminum nitride layer deposited onto the graphite layer, wherein the electrically conducting traces are deposited onto the aluminum nitride layer.

4. The structure as recited in claim 3, wherein the electrically conducting traces comprise copper.

5. A structure for electrical circuitry comprising:
electrically conducting traces;
a graphitic substrate; and
a plurality of layers separating the electrically conducting traces from the graphitic substrate, wherein the plurality of layers are selected from the group consisting of:
(i) a plurality of different ceramic dielectric layers,
(ii) a graphitic layer and a ceramic dielectric layer, and
(iii) a graphitic layer and two or more different ceramic dielectric layers,
wherein the plurality of different ceramic dielectric layers comprise a first silicon carbide layer deposited onto the graphitic substrate, a boron nitride layer deposited onto the first silicon carbide layer, and a second silicon carbide layer deposited onto the boron nitride layer, wherein the electrically conducting traces are deposited onto the second silicon carbide layer.

6. The structure as recited in claim 5, wherein the electrically conducting traces comprise copper.

7. A structure for electrical circuitry comprising:
electrically conducting traces;
a graphitic substrate; and
a plurality of layers separating the electrically conducting traces from the graphitic substrate, wherein the plurality of layers are selected from the group consisting of:
(i) a plurality of different ceramic dielectric layers,
(ii) a graphitic layer and a ceramic dielectric layer, and
(iii) a graphitic layer and two or more different ceramic dielectric layers, wherein the graphite layer and the ceramic dielectric layer comprise the graphite layer deposited onto the graphitic substrate, and an aluminum nitride layer deposited onto the graphite layer, wherein the electrically conducting traces are deposited onto the aluminum nitride layer.

8. The structure as recited in claim 7, wherein the electrically conducting traces comprise copper.

9. A method of making electrical circuitry comprising:
depositing a plurality of layers over a graphitic substrate, wherein the plurality of layers are selected from the group consisting of:
(i) a plurality of different ceramic dielectric layers,
(ii) a graphitic layer and a ceramic dielectric layer, and
(iii) a graphitic layer and two or more different ceramic dielectric layers; and
depositing electrically conducting traces on a top one of the plurality of layers, wherein depositing of the plurality of layers over the graphitic substrate comprises depositing a first silicon carbide layer onto the graphitic substrate, depositing a boron nitride layer onto the first silicon carbide layer, and depositing a second silicon carbide layer onto the boron nitride layer, wherein the electrically conducting traces are deposited onto the second silicon carbide layer.

10. The method as recited in claim 9, wherein the electrically conducting traces comprise copper.

11. The method as recited in claim 10, wherein the first and second silicon carbide layers are deposited as paste or ink formulations comprising silicon carbide powders, and
    wherein the boron nitride layer is deposited as a paste or ink formulation comprising boron nitride powders.

12. A method of making electrical circuitry comprising:
    depositing a plurality of layers over a graphitic substrate, wherein the plurality of layers are selected from the group consisting of:
        (i) a plurality of different ceramic dielectric layers,
        (ii) a graphitic layer and a ceramic dielectric layer, and
        (iii) a graphitic layer and two or more different ceramic dielectric layers; and
    depositing electrically conducting traces on a top one of the plurality of layers, wherein
    depositing of the plurality of layers over the graphitic substrate comprises depositing a graphite layer onto the graphitic substrate, and depositing an aluminum nitride layer onto the graphite layer, wherein the electrically conducting traces are deposited onto the aluminum nitride layer.

13. The method as recited in claim 12, wherein the electrically conducting traces comprise copper.

14. The method as recited in claim 13, wherein the aluminum nitride layer is deposited as a paste or ink formulation comprising aluminum nitride powders, and
    wherein the graphite layer is deposited as a paste or ink formulation comprising graphite powders.

\* \* \* \* \*